United States Patent
Ransijn

(10) Patent No.: US 6,347,128 B1
(45) Date of Patent: Feb. 12, 2002

(54) SELF-ALIGNED CLOCK RECOVERY CIRCUIT WITH PROPORTIONAL PHASE DETECTOR

(75) Inventor: Johannes Gerardus Ransijn, Wyomissing Hills, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/119,444

(22) Filed: Jul. 20, 1998

(51) Int. Cl.[7] .................................................. H03D 3/24

(52) U.S. Cl. ........................ 375/376; 375/371; 375/373; 331/11; 331/12; 713/400; 713/500

(58) Field of Search .................................. 375/376, 373, 375/354, 326, 327, 328, 371; 331/11, 12; 327/149, 152, 156; 713/400, 500, 600

(56) References Cited

U.S. PATENT DOCUMENTS

| | | | | |
|---|---|---|---|---|
| 4,871,975 A | * | 10/1989 | Nawata et al. | 329/124 |
| 5,432,480 A | * | 7/1995 | Popescu | 331/11 |
| 5,939,916 A | * | 8/1999 | Jamal et al. | 327/231 |

OTHER PUBLICATIONS

J.D.H. Alexander, "Clock Recovery from Random Binary Signals", Electron. Lett., vol. 21, pp. 541–542, Oct. 1975.

A. Buchwald et al., "Integrated Fiber Optic Receivers", pp. 291–304, Kluwer, 1995.

* cited by examiner

Primary Examiner—Mohammad H. Ghayour

(57) ABSTRACT

A self-aligned clock recovery circuit for synchronizing a local clock with an input data signal includes a sampling type phase detector for generating an output signal based on the phase difference between the local clock and the data signal timing. The phase detector obtains samples of consecutive data symbols at sampling times corresponding to transitions of the local clock, and obtains a data crossover sample at a sampling instant in between those of the consecutive data symbol samples. A phase shifter is employed to phase shift the local clock by an amount corresponding to a time varying modulation signal so as to obtain each data crossover sample at a variable sampling instant relative to the associated consecutive symbol samples. Logic circuitry determines whether the local clock appears to be early or late based on a comparison of the logic levels of the symbol samples and the associated data crossover sample, and provides a corresponding output signal through a filter to the local clock to adjust the clock accordingly. Since the relative sampling instants of successive data crossover samples are varied with time, the phase detector output signal amplitude is substantially proportional to the amount of phase error between the local clock and the symbol timing, thereby improving jitter properties of the clock recovery circuit.

20 Claims, 9 Drawing Sheets

SELF-ALIGNED CLOCK RECOVERY CIRCUIT WITH PROPORTIONAL PHASE DETECTOR

BACKGROUND OF THE INVENTION

The present invention relates generally to clock recovery circuitry and digital data regeneration.

Clock recovery circuits are employed within optical and RF receivers to establish synchronization between a locally generated clock and the timing of a bit stream within a received data signal. The local clock, once synchronized to the incoming data signal, is used to control regeneration of the data.

FIG. 1 is a simplified block diagram of a conventional clock recovery and data regeneration circuit 10. A non-return-to-zero (NRZ) data signal is received by an optical or RF receiver. A phase lock loop comprised of a phase detector 12, loop filter 14 and voltage controlled oscillator (VCO) 16 derives a recovered clock signal synchronized to the symbol stream of the data signal. Phase detector 12 continually compares the VCO clock phase to the data signal phase and provides an output signal to the loop filter accordingly. High data rate systems often employ a sampling type of phase detector in which samples of the data signal are taken at the data transition (crossover) regions as well as at the approximate midpoints of each data bit to achieve precise alignment of the clock. Loop filter 14 low pass filters the phase detector output to provide a control voltage to VCO 16 to adjust the clock frequency (align the clock) so that it tracks the data rate of the data signal. Regeneration of the data signal is accomplished by means of a comparator 17 that compares the data signal level to a decision threshold level $V_{DT}$ to generate a solid logic level, which is then routed through a D flip-flop 18 clocked by the synchronized VCO clock.

As data rates in fiber optic and microwave systems continue to increase, alignment of jittered data and the recovered clock inside the receiver becomes ever more critical. Misalignment results in a reduced sensitivity to jitter and, consequently, reduces the allowable bandwidth of the optical signal (reduced fiber span).

Regenerator architectures employing sampling phase detectors are promising, since alignment is an inherent property for these types of circuits. Also, the sampling phase detector output is generated through post-processing of data samples; in demultiplexing regenerators, such processing can be deferred to lower bit rates.

A drawback to the sampling phase detector, however, is that the phase detector characteristic is a signum function (output which is either zero, a predetermined positive value or negative value) which renders the jitter properties of the receiver non-linear. Analog linear phase detectors, by contrast, provide an output which is proportional in amplitude to the phase error between the input signals, resulting in good jitter tolerance properties. Applications that require jitter transfer compliance, such as SONET regenerators or optical translators, have therefore been dominated by clock recovery circuits with linear, but non-self-aligned, phase detectors.

SUMMARY OF THE DISCLOSURE

The present disclosure pertains to a self-aligned clock recovery circuit for synchronizing a local clock with an input data signal. In an illustrative embodiment, the clock recovery circuit includes a sampling type phase detector for generating an output signal based on the phase difference between the local clock and the data signal timing. The phase detector includes sampling circuitry for obtaining samples of consecutive data symbols at sampling times corresponding to transitions of the local clock, and for obtaining a data crossover sample at a sampling instant in between those of the consecutive data symbol samples. A phase shifter is employed to phase shift the local clock by an amount corresponding to a time varying modulation signal so as to obtain each data crossover sample at a variable sampling instant relative to the associated consecutive symbol samples. Logic circuitry determines whether the local clock appears to be early or late based on a comparison of the logic levels of the symbol samples and the associated data crossover sample, and provides a corresponding output signal through a filter to the local clock to adjust the clock accordingly.

BRIEF DESCRIPTION OF THE DRAWINGS

The following detailed description, given by way of example and not intended to limit the present invention solely thereto, will best be appreciated in conjunction with the accompanying drawings, in which like reference numerals denote like parts or elements, wherein.

DETAILED DESCRIPTION OF CERTAIN PREFERRED EMBODIMENTS

To provide a foundation for the teachings of the present invention, the operation of a prior art clock recovery circuit based on a sampling phase detector will first be discussed in detail. An illustrative embodiment of the invention to be described represents an improvement upon this prior art circuit.

Figure 1:
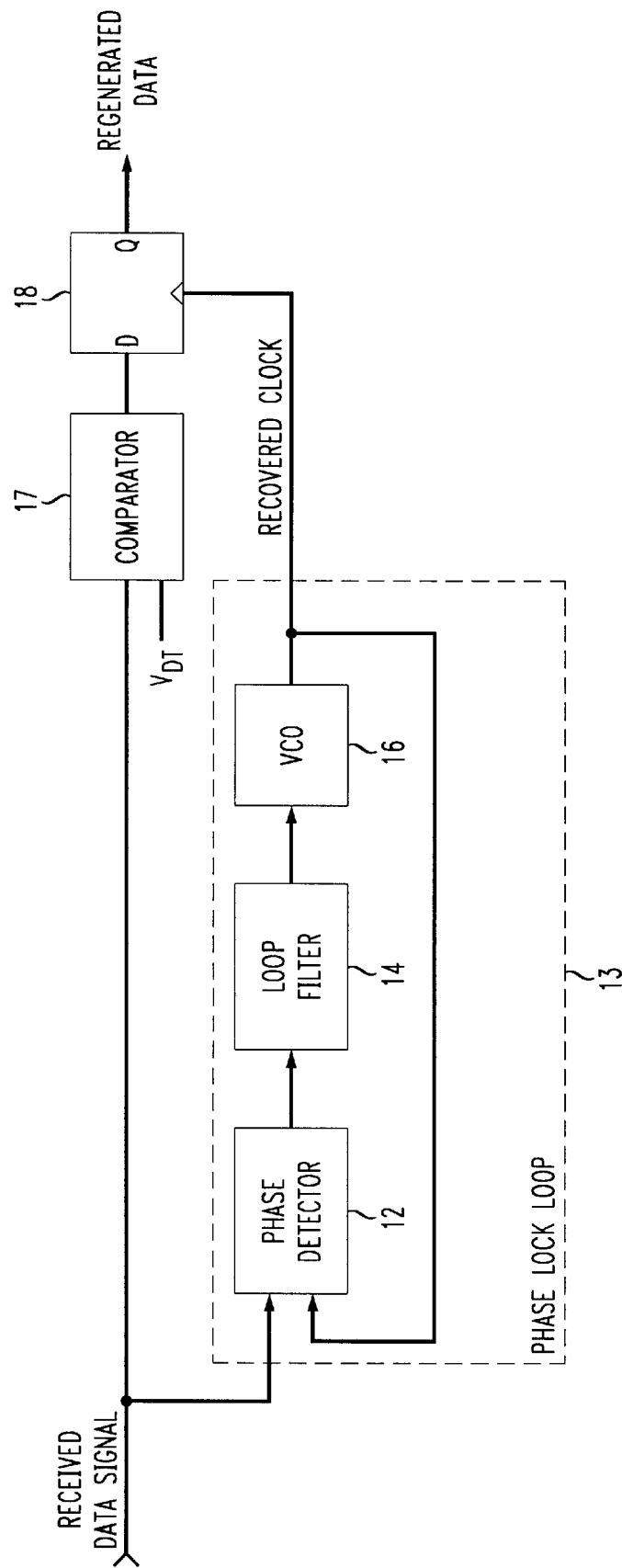
FIG. 1 is a simplified block diagram of a clock recovery and data regeneration system.
Figure 2:
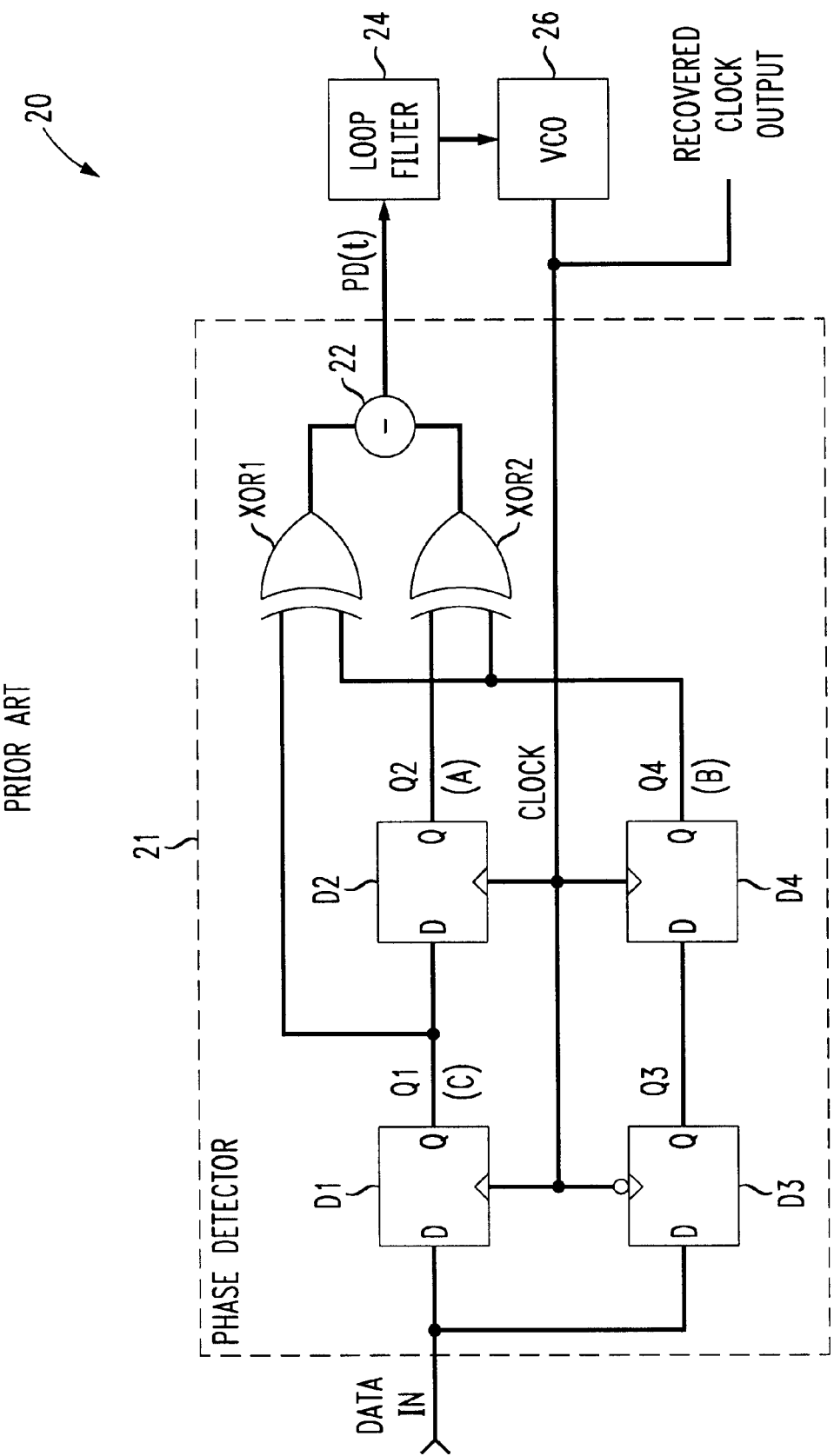
FIG. 2 is a circuit diagram of a prior art clock recovery circuit.

Referring now to FIG. 2, prior art clock recovery circuit 20 includes a sampling phase detector 21 that receives an input data signal, a loop filter 24 and a VCO 26 (local clock generator) which provides a recovered clock output based on the input data signal. Clock recovery circuit 20 functions to synchronize the VCO clock output with the symbol to symbol timing of the input data signal. Phase detector 21 is comprised of four sampling circuits D1–D4, a pair of exclusive OR gates XOR1, XOR2 and a subtracter 22 which subtracts the output of XOR1 from XOR2. Phase detector 21 is known as the Alexander phase detector and is widely used in present day high speed clock recovery circuits. This type of phase detector is disclosed in an article entitled "Clock Recovery from Random Binary Signals," by J. D. H. Alexander, Electron. Lett., vol. 21, pp. 541–542, October 1975.

In operation, an input data signal to be regenerated is received at the D inputs of sampling circuits D1 and D3. The data signal is typically a bit stream of non-return-to-zero (NRZ) data. Sampling circuits D1–D4 may each be embodied as a simple clocked D flip-flop, but each preferably includes an internal comparator (not shown) at the input D port. The comparator compares the amplitude of the input signal at the clocked sampling instant to a decision threshold to determine if the sample is closer to a logic 0 or logic 1. The logic level so determined is transferred to the Q output and held there until the next clock transition (positive transition for circuits D1, D2 and D4 and negative transition for D3) appears at the clock input port. Without the internal comparator in the D1 and D3 circuits, a typical clocked D flip-flop would provide an indeterminate output for data signal levels at the zero crossings between bits.

Figure 3:
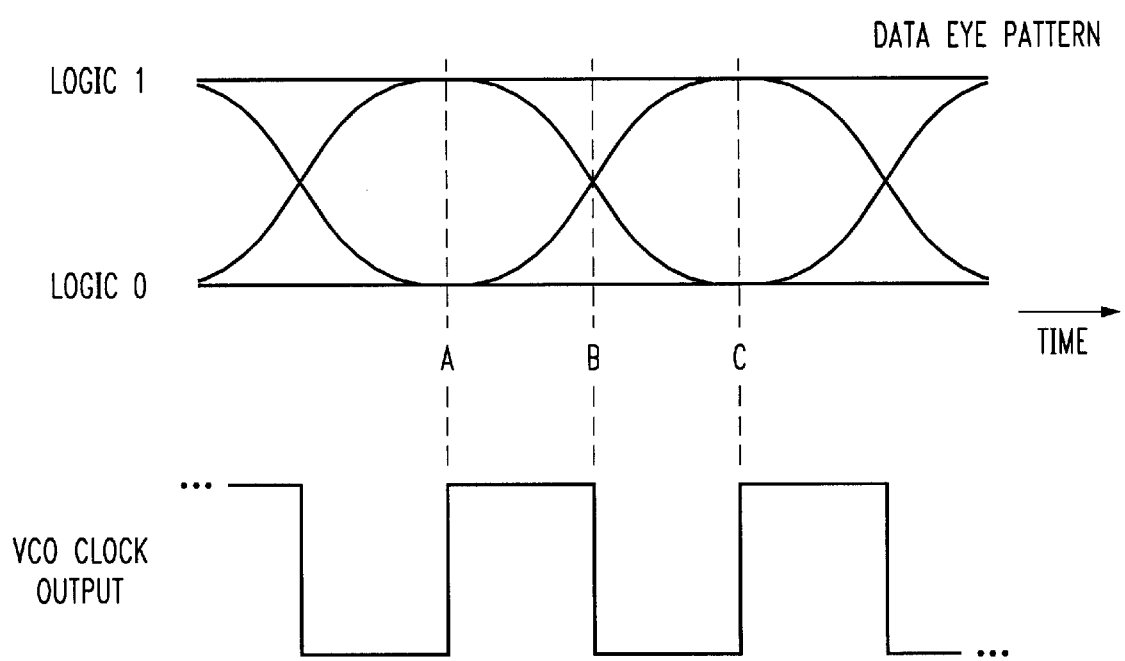
FIG. 3 illustrates sampling instants within a data eye pattern for the circuit of FIG. 2.

FIG. 3 shows an illustrative eye pattern for the input data signal in relation to an aligned VCO clock output. Sampling points A and C on the eye pattern represent the midpoints of two consecutive bits of the data signal. Data samples are taken at these points if the clock is precisely aligned with the data timing. Sample point B is at the crossover point (zero crossing) between successive bits if the clock is perfectly aligned. If there is no data transition between consecutive sampling points A and C (i.e., if the A and B samples are at the same logic level) then the B sample is at the same logic level as the A and C samples. If there is a data transition and the clock is slightly early, the B sample is taken prior to the crossover time and will thus equal the logic level of the A sample. Conversely, if the clock is slightly late, the B sample will equal the C sample logic level.

Referring still to FIGS. 2 and 3, sampling circuits D1, D2 and D4 are clocked together by the clock output of VCO 26 and sample the D input at the leading edge of the clock pulse. Sampling circuit D3 samples the D input at the trailing edge of the clock. Since the output Q1 of sampling circuit D1 is applied to D2 and the output Q3 of D3 feeds D4, sampling circuit D1 stores the most recent bit, bit C; D2 stores the previous bit, bit A; and D4 stores the crossing point sample B. That is, the logic level of the zero crossing sample B appears at output Q4 of latch D4 at the same time that logic levels of samples A and C appear on outputs Q2 and Q1, respectively.

By comparing Q4 with Q1 and Q2, it can be determined whether the clock is early or late as follows:

| | |
|---|---|
| Early (E) when | A = B ≠ C |
| Late (L) when | A ≠ B = C |
| No decision (X) is possible if | A = B = C |
| or if | A = C ≠ B. |

These four conditions are detected by applying the B and C samples to exclusive OR ate XOR1, applying the A and B samples to gate XOR2, and by subtracting the output of XOR1 from XOR2 using the analog subtracter 22. The following truth table depicts the detection conditions:

| A | B | C | DECISION | A⊕B | B⊕C | A⊕B − B⊕C |
|---|---|---|---|---|---|---|
| 0 | 0 | 0 | X | 0 | 0 | 0 |
| 0 | 0 | 1 | E | 0 | 1 | −1 |
| 0 | 1 | 0 | X | 1 | 1 | 0 |
| 0 | 1 | 1 | L | 1 | 0 | 1 |
| 1 | 0 | 0 | L | 1 | 0 | 1 |
| 1 | 0 | 1 | X | 1 | 1 | 0 |
| 1 | 1 | 0 | E | 0 | 1 | −1 |
| 1 | 1 | 1 | X | 0 | 0 | 0 |

In the truth table, A⊕B represents the output of XOR2; B⊕C represents the output of XOR1; and A⊕B−B⊕C represents the phase detector output PD(t). Hence, if the clock is late, PD(t) will vary between zero volts and the logic high voltage (e.g., 0 to +5V), depending on whether or not a data transition has occurred. If the clock is early, PD(t) will vary between zero volts and the negative value of the logic high voltage (e.g., 0 to −5V). Whether the clock is early or late, the average value of PD(t) over a relatively short time interval will depend on the data transition density, i.e., the number of transitions between 1's and 0's within a certain time interval. More specifically, if the function $\overline{A(t)}$ describes the average data transition density, the mean phase detector output $\overline{PD(t)}$ can be expressed as:

$$\overline{PD(t)} = \overline{A(t)} \text{sign}(\phi),$$

where "sign" denotes the signum function φ and is the data phase, i.e., the phase difference between the symbol timing of the data signal and the VCO clock signal.

Figure 4:
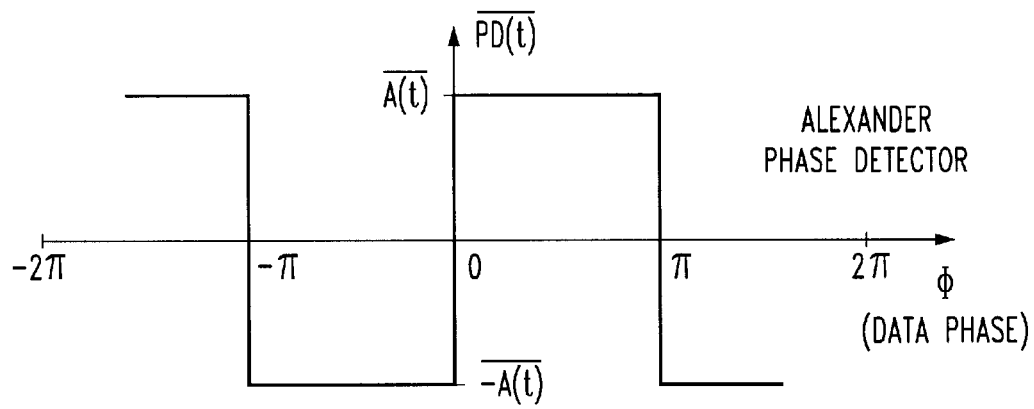
FIGS. 4 and 5 illustrate phase detector output waveforms of prior art phase detectors.

Referring to FIG. 4, the mean phase detector output $\overline{PD(t)}$ is plotted as a function of data phase φ. A late clock corresponds to the data phase in the range of 0–π, 2π–3π, etc. In this case, $\overline{PD(t)}$ equals the positive voltage $\overline{A(t)}$, which is applied to VCO 26 through loop filter 24 to speed up the VCO output clock frequency towards clock alignment with the input data signal. When the clock is early (data phase in the range of −π to 0, π−2π, etc.) $\overline{PD(t)}$ falls to −A(t). This negative voltage operates to slow the VCO clock frequency towards clock alignment. In this manner, the clock becomes self-aligned with the data signal.

Figure 5:
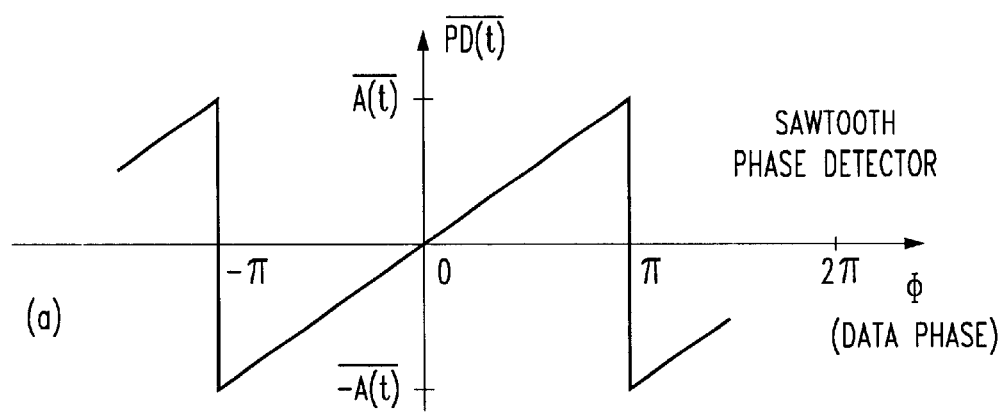

While the Alexander phase detector has desirable self-aligning properties as just described, it exhibits several drawbacks. First, the mean phase detector output over a given time interval is not proportional to the magnitude of the data phase. Rather, the output is the discrete function, as seen in FIG. 4, which takes on only one of two values independent of the clock misalignment (for a given data transition density). This property is unlike that of a linear analog phase detector such as the sawtooth phase detector. As shown in FIG. 5, the output of the sawtooth phase detector is proportional to the phase error of the clock. By contrast, the Alexander phase shifter lacks such a proportional output and thus the dynamic properties (jitter transfer, jitter tolerance) are highly dependent on the jitter distribution of the data edges, in terms of amplitude as well as frequency.

Further, because of the symmetry of the Alexander phase detector output characteristic, there is no way of extracting a frequency-dependent signal therefrom. By contrast, the sawtooth phase detector lends itself very well to the addition of a frequency detector. Referring to FIG. 5, if the VCO clock frequency is too high, the phase detector output as a function of time will resemble the shown sawtooth waveform (shown as a function of data phase) because the VCO clock phase error, i.e., the data phase, will be increasing linearly with time. If the VCO clock frequency is too low, the sawtooth waveform will be inverted. The slope of the sawtooth can be correlated with the frequency error. Hence, a frequency detector may be employed to readily detect the error. For instance, a frequency detector that combines a differentiator and a limiter can be used which produces a signal with a frequency sensitive DC component. See, A. Buchwald and K. Martin, *Integrated Fiber Optic Receivers*, Chapter 5, Kluwer, 1995.

Hence, since the Alexander phase detector detects phase information only at the zero crossings, the result is a discrete output with limited phase error information. The present invention recognizes that by deriving additional phase information other than merely at the zero crossings, a phase detector output that is substantially proportional to the local clock phase can be produced with the attendant advantages—superior phase jitter performance as well as frequency detection capability.

One way to compensate for the loss of phase information is by oversampling. If samples are taken at multiple points between the A and C samples, rather than just in the center, and the results weighed, a proportional measure of the phase difference would be obtained. This objective could be achieved by adding sampling circuits driven by multiple clock phases; however, such an approach would dramatically complicate the design. It would result in a "staircase" output which is still discrete in nature.

In accordance with the invention, instead of performing strict oversampling, the extra "B" samples are spread out in the time domain. That is, the exact sampling instant of the B sample with respect to the A and C samples is changed from data bit to data bit. This concept will be referred to hereafter as time domain oversampling. The approach is feasible because the interest in the phase difference is limited to relatively low frequencies—i.e., relatively slow variations in a fast varying data signal. Consequently, the time domain oversampling rate can be low.

Figure 6:
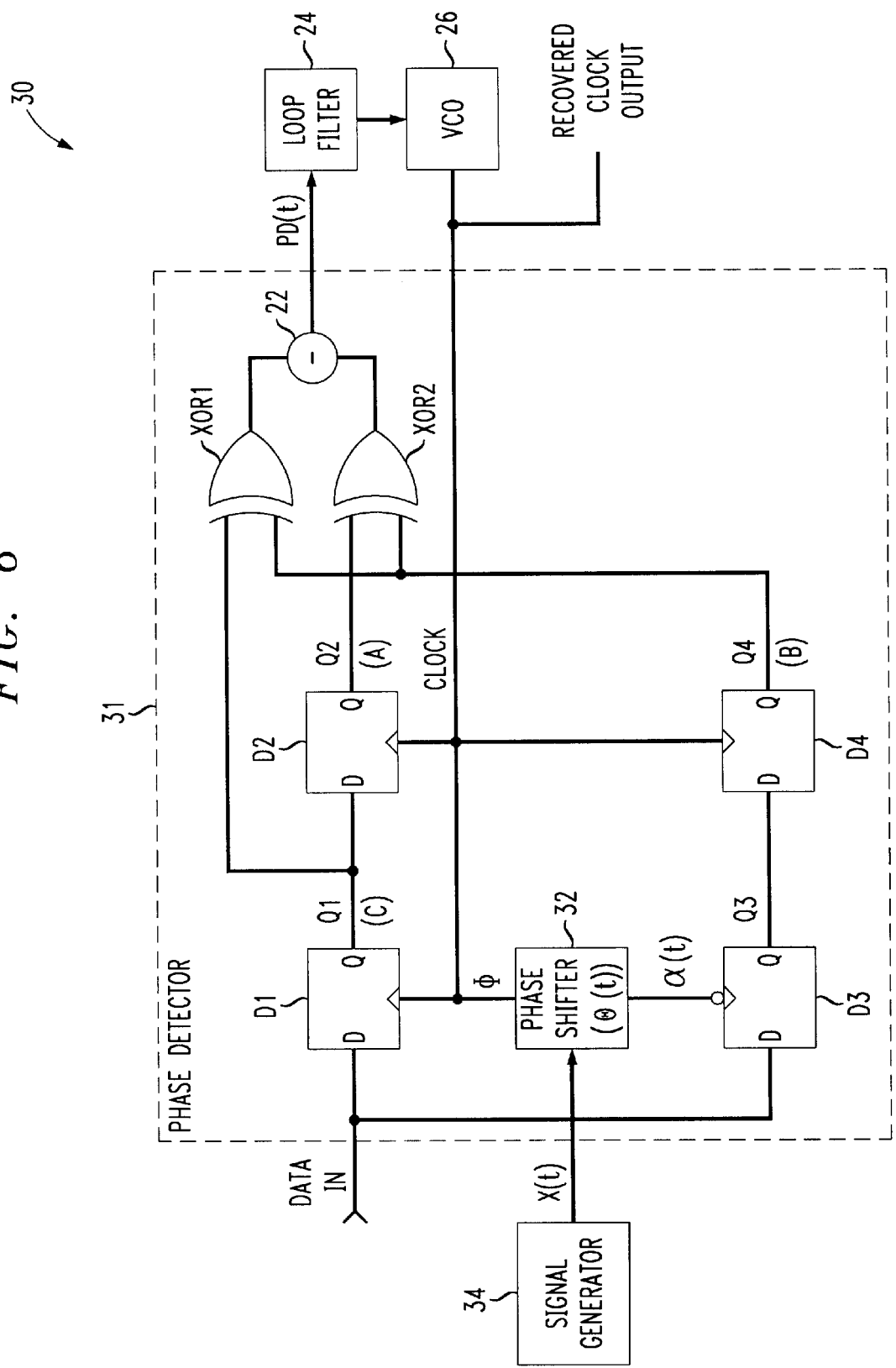
FIG. 6 is a circuit diagram of an illustrative embodiment of a clock recovery circuit in accordance with the present invention.

With reference now to FIG. 6, a clock recovery circuit 30 in accordance with the invention is schematically illustrated. Clock recovery circuit 30 employs a modified phase detector 31 having a phase shifter 32 in the clock path of sampling circuit D3. The phase shifter operates to alter the phase of the VCO clock applied thereto in a time varying manner. A signal generator circuit 34 is adapted to produce a modulating signal X(t) to modulate or sweep the phase of phase shifter 32, thereby varying the phase of the B sample instant relative to the associated A and C sample instants. The other components of clock recovery circuit 30 perform basically the same functions as the corresponding components of the Alexander circuit 20 described earlier. In essence, phase detector 31, loop filter 24 and VCO 26 form a phase lock loop (PLL) that functions to generate a clock signal from the input data signal for the purpose of data regeneration. The design of loop filters and VCO's of PLL's are well known to those skilled in the art and will not be described herein. Clock recovery circuit 30 is typically part of a high speed receiver such as an optical receiver operating to receive information-bearing signals with data rates in the Gb/s range. The recovered clock is fed to data regeneration circuitry (not shown) within the receiver. Clock recovery circuit 30 can be manufactured as part of a single integrated circuit.

The amplitude of the modulating function X(t), in conjunction with the transfer characteristics of phase shifter 32, determine the range over which the clock recovery circuit is sensitive to phase changes. Although this range can be as large as $2\pi$ (i.e., from $-\pi$ to $\pi$), a range of $\pi$ (from $-\pi/2$ to $\pi/2$) is generally sufficient. The modulating function X(t) can, for example, be a sinusoidal function, non-linear function or a direction-changing linear function such as a triangular wave train or a sawtooth waveform.

In the ensuing discussion, the data phase $\phi$ represents the phase misalignment between the VCO clock and the data signal; $\theta(t)$ is the time varying phase shift incurred through phase shifter 32 as controlled by the modulating function X(t) (hereafter, $\theta(t)$ will be referred to as the modulating signal); and $\alpha(t)=\theta(t)+\phi$ represents the instantaneous phase misalignment of the phase shifted clock signal applied to sampling circuit D3 with respect to the data signal (i.e., $\alpha(t)$ is the phase of the "B" sample).

Figure 7A:
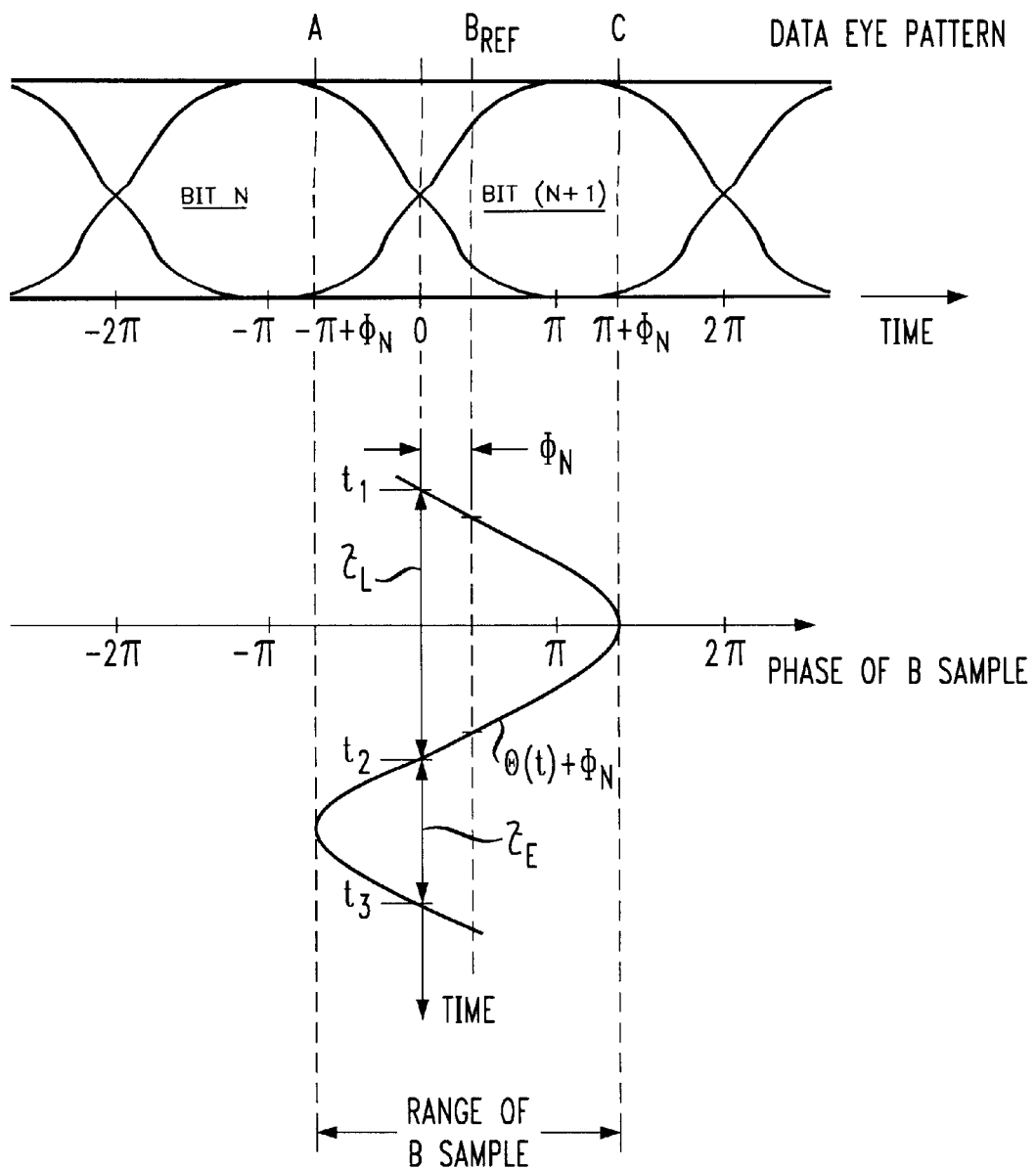
FIGS. 7A and 7B illustrate data eye patterns and sampling instants for the illustrative clock recovery circuit of FIG. 6.

Referring to FIG. 7A, the impact of the modulation of sample B is illustrated with a second time axis drawn to show the progress of the modulating signal $\theta(t)$. The top diagram shows a data eye pattern for two successive bits N and (N+1). The time axis of the eye pattern is expressed in radians wherein $2\pi$ corresponds to the time between the edges of two successive data samples, i.e., $2\pi$ equals the period of the data signal. The zero crossing reference between the two bits under consideration corresponds to 0 radians. In this example it is assumed that the modulating signal $\theta(t)=\pi \sin(\Omega t)$ so that the phase excursion range of the B sample is $\pm\pi$. The radian frequency $\Omega$ of the modulating signal can be set as low as twice the phase lock loop (PLL) bandwidth. (If $\Omega$ is set lower than twice the PLL bandwidth, aliasing may occur.) A typical value for the PLL bandwidth is about 2 MHz for data rates on the order of 2 Gb/s.

It is further assumed in the example of FIG. 7A that the VCO clock is late by $\phi_N$, the data phase for the Nth sample. If the clock were perfectly aligned, the A and C samples would be taken at $-\pi$ and $\pi$, respectively; instead, they are taken at $-\pi+\phi_N$ and $\pi+\phi_N$, respectively. Now, if the modulating function $\theta(t)$ were zero at all times, the B sample would always be taken at the time $\phi_N$ (designated as the $B_{REF}$ sample on the diagram). This condition would correspond to the B sampling instant within the Alexander circuit discussed above. (In the Alexander circuit, the next B sample would occur $2\pi$ radians later, assuming negligible change in the VCO frequency in such a short time interval, that is, assuming the data phase associated with the next data bit N+1 is the same as $\phi_N$). With the present embodiment, a nonzero modulating function $\theta(t)$ ensures that the relative sampling instant of the B sample varies from data bit to data bit. In the example shown in FIG. 7A with a sinusoidal modulating function having a range of $\pm\pi$, the B sampling instant relative to the A and C sample instants varies sinusoidally with time and falls within the range of $-\pi+\phi_N$ to $\pi+\phi_N$.

Figure 7B:
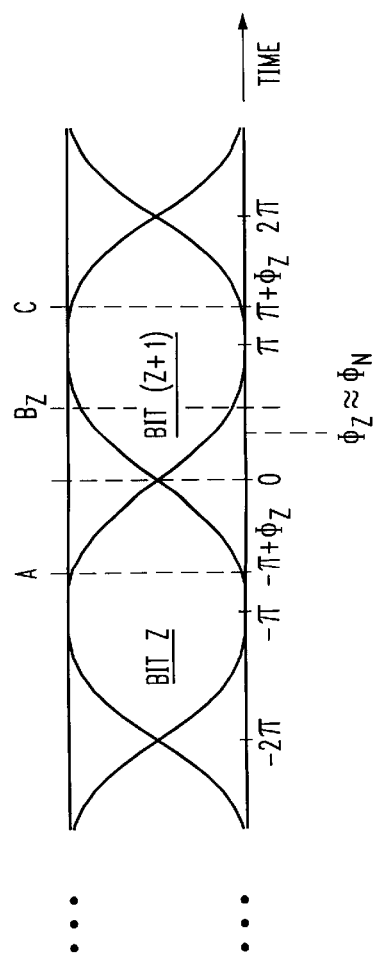
Figure 7B:
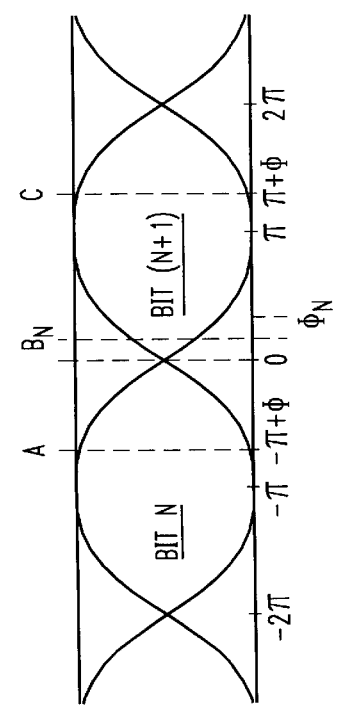

Referring momentarily to FIG. 7B, the data eye pattern of FIG. 7A is extended to further illustrate the concept of time domain oversampling of the present invention. In FIG. 7B it is assumed that, as a result of the modulating function $\theta(t)$, the B sample "$B_N$" associated with bits N and N+1 of the data signal is taken at a time prior to the data phase $\phi_N$ of the Nth sample. It is further assumed that by the time bit Z of the data signal arrives, the data phase $\phi_Z$ still approximately equals the previous value $\phi_N$. However, by this time the value of the modulating function $\theta(t)$ has changed such that the B sample $B_Z$ associated with bits Z and Z+1 is taken after the relative data phase $\phi_Z$.

Returning to FIG. 7A, the net result of the phase shifting operation with $\theta(t)$ is that the average data phase measured for a succession of data samples will correspond to the mean sampling phase of the B samples. More specifically, during the time interval $\tau_L$ between instants $t_1$ and $t_2$ the phase detector produces late pulses for every data transition.

During time interval $\tau_E$ between times $t_2$ and $t_3$, it generates early pulses. Instants $t_1$, $t_2$ and $t_3$ are defined as the instants when the phase $\alpha(t)=\theta(t)+\phi$ of the B sample equals zero or, when the B sample is taken at the data eye crossing. The following expressions can be used to derive the relationship between $\tau_L$, $\tau_E$ and the data phase $\phi$ for the example of a sinusoidal modulating function $\theta(t)$:

$$\alpha(t)=\phi+\theta(t)=\phi+\pi\sin(\Omega t);$$

$$0=\phi\pi\sin(\Omega t_{1,2,3});$$

$$\Omega t_1=\arcsin(\phi/\pi);\ \Omega t_2=\pi-\arcsin(\phi/\pi);$$

$$\Omega \tau_L=\Omega t_1-\Omega t_2=\pi-2\arcsin(\phi/\pi),$$

resulting in:

$$\Omega(\tau_L-\tau_E)=\Omega\tau_L-[2\pi-\Omega\tau_L]=2\Omega\tau_L-2\pi=4\arcsin(\phi/\pi).$$

Figure 8:
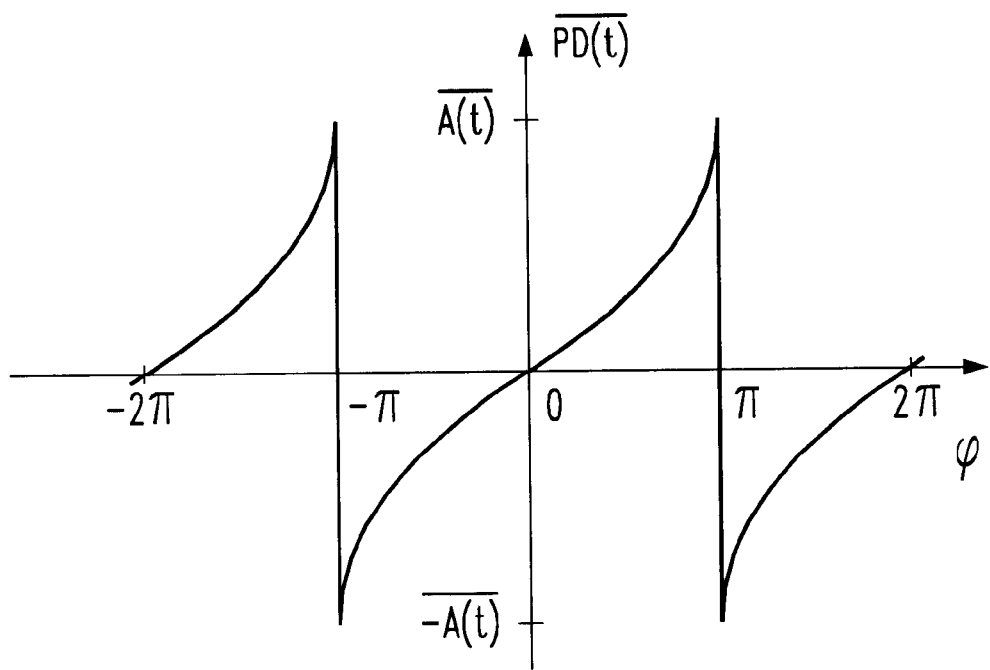
FIG. 8 depicts an exemplary phase detector output as a function of clock phase error for the illustrative embodiment.

As shown in FIG. 8, the resulting phase detector characteristic is proportional to the inverse of the modulating function $\theta(t)$. The plot illustrates the mean phase detector output level $\overline{PD(t)}$ as a function of data phase for the sinusoidal modulating function $\theta(t)=\pi\sin(\Omega t)$. Intuitively, if the clock is only slightly misaligned ($\phi$ is close to zero) then the ratio of $\tau_L$ to $\tau_E$ is nearly 1.0. Consequently, after each data transition, the output of the subtracting circuit 22 (FIG. 6) will equal the average transition density $\overline{A(t)}$ (corresponding to a late clock) about half of the time and $-\overline{A(t)}$ (corresponding to an early clock) the rest of the time. Thus, on the average, $\overline{PD(t)}$ is close to zero as shown. On the other hand, if, for example, the clock is substantially early whereby $\phi$ is close to $-\pi$, then the ratio of $\tau_E$ to $\tau_L$ is high and the mean phase detector output approaches $-\overline{A(t)}$ (or $\overline{A(t)}$ if the clock is late by about $\pi$ radians). Hence, the output function of FIG. 8 results. Note that the mean output $\overline{PD(t)}$ would be linear within each $2\pi$ segment if the modulating function $\theta(t)$ were a triangular wave or sawtooth wave.

Accordingly, clock recovery circuit 30 of FIG. 6 provides a phase detector output signal that is essentially proportional to the clock phase error relative to the symbol timing of the data signal. As a consequence, the phase detector can be expected to have jitter properties similar to analog type phase detectors, while preserving the desirable self-alignment properties of the Alexander type clock recovery circuit.

Figure 9:
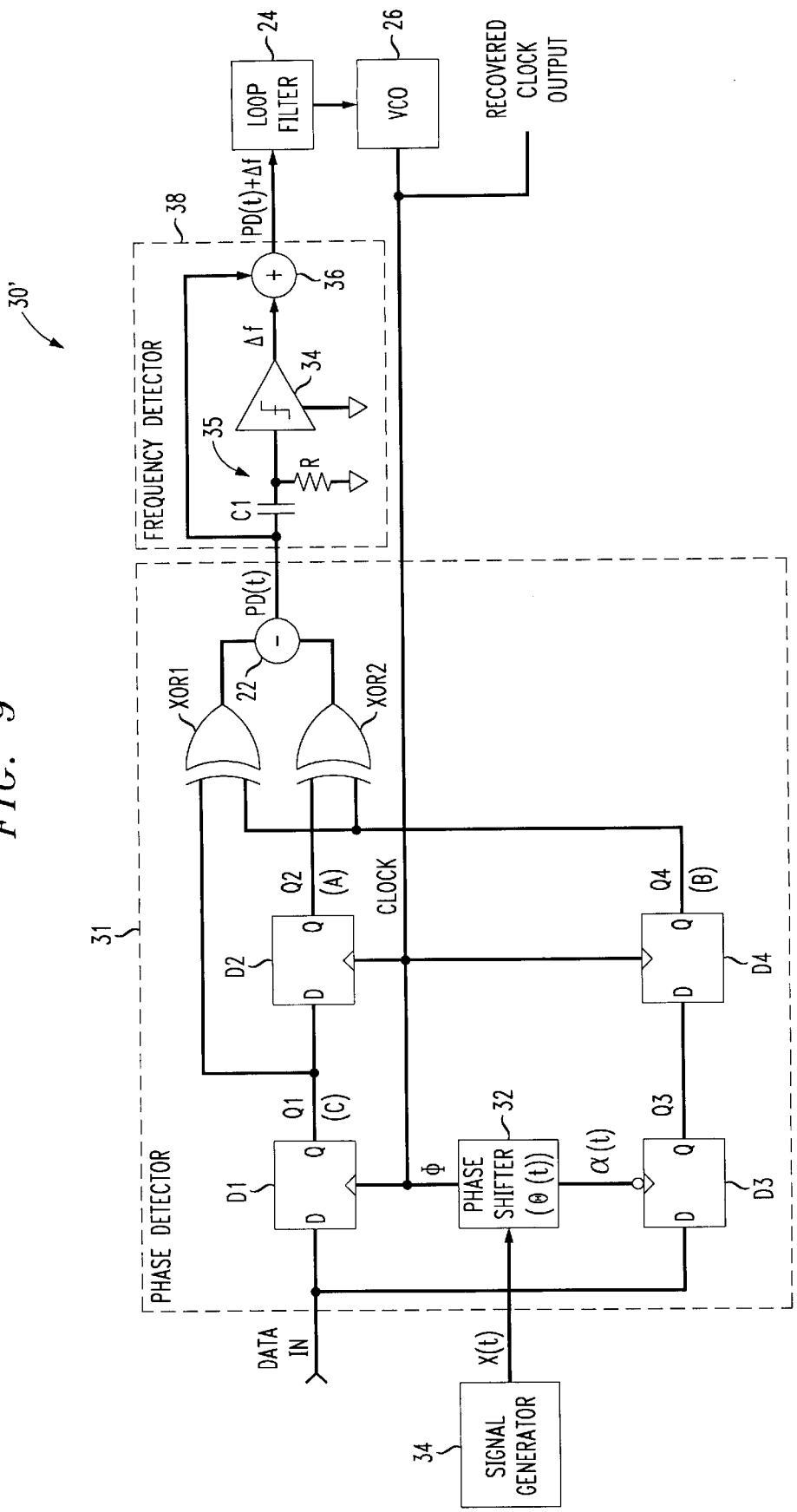
FIG. 9 is a block diagram of an embodiment of a clock recovery circuit employing a frequency detector.

In addition, due to the proportional output, the circuit is amenable to the addition of a frequency detector, as shown in the embodiment 30' of FIG. 9. The only constraint in this case is that the sampling frequency must be high enough to accommodate the difference frequency between clock and data to prevent aliasing. The addition of frequency detector 38 ensures that frequency acquisition will occur upon start-up, even if the maximum frequency error between the data signal and the VCO clock exceeds the closed loop bandwidth of the PLL. Frequency detector 38 can be realized by a differentiator 35 comprised of capacitor C1 and resistor R; a comparator 34 which provides an output $\Delta f$ corresponding to the frequency error; and an adder 36 for summing the phase detector output PD(t) with $\Delta f$, the sum then being provided to loop filter 24.

While the present invention has been described above with reference to specific embodiments thereof, it is understood that one skilled in the art may make many modifications to the disclosed embodiments without departing from the spirit and scope of the invention. For instance, while the illustrative embodiment is designed to receive an input data signal comprised of a bit stream (binary data), it may be modified to enable synchronization with an input data signal having a non-binary symbol stream. As another example, the logic circuitry consisting of a pair of exclusive OR gates and a subtracter may be substituted with other logic circuitry, such as a look-up table, to achieve the same basic function. Further, while the disclosed embodiments sample consecutive data symbols and the data crossover region therebetween to synchronize the local clock, in certain applications, sampling can be performed at a lower clock frequency such that every Nth symbol is sampled along with a data crossover region midway between the sampled symbols. Moreover, sample and hold circuits that do not convert an input signal sample to a logic level, but instead, transfer the exact input signal level to an output port, may be employed in place of the D2 and either the D3 or D4 sampling circuits of the illustrative embodiment. Accordingly, these and other modifications are intended to be included within the scope of the invention as defined by the appended claims.

What is claimed is:

1. A clock recovery circuit for synchronizing a local clock of a local clock generator with symbol timing of an input data signal, comprising:

means for phase shifting said local clock by a time varying phase shift to provide a phase shifted clock signal, wherein said time varying phase shift is characterized by a piecewise continuous symmetrical function;

sampling circuitry for obtaining first and second data samples of said data signal at respective first and second sampling instants corresponding to pulses of said local clock, and for obtaining a third sample of said data signal, responsive to a transition of said phase shifted clock signal, at a third sampling instant in between the first and second sampling instants, said third sampling instant varying in time for each symbol sample relative to said first and second sampling instants;

logic circuitry operative to determine, based on said first, second and third data samples, whether the clock appears to be early or late and to provide an output signal in accordance with the determination; and a filter, for filtering said output signal and providing the filtered signal to said local clock generator to adjust the local clock accordingly and thereby synchronize the local clock to the symbol timing.

2. The clock recovery circuit of claim 1 wherein said time varying phase shift is sufficient to enable said output signal to be provided with a mean amplitude substantially proportional to the phase error between the local clock and the symbol timing of the data signal.

3. The clock recovery circuit of claim 1 wherein said time varying phase shift is a phase shift selected from the group consisting of a sinusoidally varying phase shift, a phase shift varying as a sawtooth waveform, and a phase shift varying as a triangular wave.

4. The clock recovery circuit of claim 1 wherein said first and second data samples are samples of consecutive symbols of said data signal and said first and second sampling instants correspond to edge transitions of consecutive pulses of said local clock.

5. The clock recovery circuit of claim 1 wherein said data signal is a bit stream.

6. The clock recovery circuit of claim 1 wherein said sampling circuitry comprises:

a first sampling circuit for sampling said input data signal;

a second sampling circuit for receiving a data output of said first sampling circuit, said first and second sampling circuits being clocked in synchronism by said local clock such that at a given time, said first and second sampling circuits output said first and second data samples, respectively;

third and fourth sampling circuits, said third sampling circuit having a data input for receiving said input data signal and providing a data output to said fourth sampling circuit, said fourth sampling circuit being clocked by said local clock, said third sampling circuit being clocked by said phase shifted clock signal so that an output of said fourth sampling circuit at said given time represents said data crossover sample which is taken at a variable data crossover sampling instant relative to said first and second sampling instants.

7. The clock recovery circuit of claim 6 wherein each of said sampling circuits include a D flip-flop.

8. The clock recovery circuit of claim 6 wherein said logic circuitry comprises first and second exclusive OR gates and a subtracter, with said data outputs of said first and fourth sampling circuits being inputted to said first exclusive OR gate, said data outputs of said second and fourth sampling circuits being inputted to said second exclusive OR gate, and said subtracter subtracting the output of said first exclusive OR gate from the output of said second exclusive OR gate to provide said output signal.

9. The clock recovery circuit of claim 1 wherein said local clock generator is a voltage controlled oscillator.

10. The clock recovery circuit of claim 1, further comprising a frequency detector coupled between said logic circuitry and said filter.

11. A method of synchronizing a local clock with symbol timing of an input data signal, comprising the steps of:

obtaining first and second data samples of said data signal at respective first and second sampling instants corresponding to edge transitions of said local clock;

phase shifting said clock by a piecewise continuous symmetrical time varying phase shifting function to provide a phase shifted clock signal and obtaining a third data sample of said data signal, responsive to an edge transition of said phase shifted clock signal, at a third sampling instant in between the first and second sampling instants, wherein said third sampling instant varies for each symbol sample relative to said first and second sampling instants;

determining, based on said first, second and third data samples, whether the clock appears to be early or late and providing an output signal in accordance with the determination; and filtering said output signal and adjusting the local clock responsive to the filtered output signal to thereby synchronize the local clock to the symbol timing of the data signal.

12. The method of claim 11 wherein said time varying phase shift is sufficient to enable said output signal to be provided with a mean amplitude substantially proportional to the phase error between the local clock and the symbol timing of the data signal.

13. The method of claim 11 wherein said time varying phase shift is selected from the group consisting of a sinusoidally varying phase shift, a phase shift varying as a sawtooth waveform, and a phase shift varying as a triangular wave.

14. The method of claim 11 wherein said first and second data samples are samples of consecutive symbols of said data signal and said first and second sampling instants correspond to edge transitions of consecutive pulses of said local clock.

15. The method of claim 11, further comprising detecting a frequency error between said local clock and said symbol timing based on said output signal, generating a corresponding frequency error signal and adding it to said output signal prior to said filtering step.

16. The method of claim 12 wherein:

said clock is determined to be early when said first data sample equals said data crossover sample and is unequal to said second data sample, said output signal being provided at a first level when said clock is determined to be early;

said clock is determined to be late when said second and data crossover samples are equal and said first and data crossover samples are unequal, said output signal being provided at a second level when said clock is determined to be late; and said output signal is provided at a third level corresponding to a no-decision result when said first, second and data crossover samples are equal or said first and second data samples are equal to one another and are unequal to said data crossover sample.

17. An integrated circuit comprising a clock recovery circuit for synchronizing a local clock of a local clock generator with symbol timing of an input data signal, characterized in that said clock recovery circuit comprises:

means for phase shifting said local clock by a time varying phase shift to provide a phase shifted clock signal, wherein said time varying phase shift is characterized by a piecewise continuous symmetrical function;

sampling circuitry for obtaining first and second data samples of said data signal at respective first and second sampling instants corresponding to pulses of said local clock, and for obtaining a third sample of said data signal, responsive to a transition of said phase shifted clock signal, at a third sampling instant in between the first and second sampling instants, said third sampling instant varying in time for each symbol sample relative to said first and second sampling instants;

logic circuitry operative to determine, based on said first, second and third data samples, whether the clock appears to be early or late and to provide an output signal in accordance with the determination; and a filter, for filtering said output signal and providing the filtered signal to said local clock generator to adjust the local clock accordingly and thereby synchronize the local clock to the symbol timing.

18. The integrated circuit of claim 17 wherein said time varying phase shift is a phase shift selected from the group consisting of a sinusoidally varying phase shift, a phase shift varying as a sawtooth waveform, and a phase shift varying as a triangular wave.

19. A receiver for receiving an input data signal, comprising:

a clock recovery circuit for synchronizing a local clock of a local clock generator with symbol timing of said input data signal, said clock recovery circuit including:

means for phase shifting said local clock by a time varying phase shift to provide a phase shifted clock signal, wherein said time varying phase shift is characterized by a piecewise continuous symmetrical function;

sampling circuitry for obtaining first and second data samples of said data signal at respective first and second sampling instants corresponding to pulses of said local clock, and for obtaining a third sample of said data signal, responsive to a transition of said phase shifted clock signal, at a third sampling instant in between the first and second sampling instants, said third sampling instant varying in time for each symbol sample relative to said first and second sampling instants;

logic circuitry operative to determine, based on said first, second and third data samples, whether the clock appears to be early or late and to provide an output signal in accordance with the determination; and a filter, for filtering said output signal and providing the filtered signal to said local clock generator to adjust the local clock accordingly and thereby synchronize the local clock to the symbol timing.

20. The receiver of claim 19 wherein said time varying phase shift is a phase shift selected from the group consisting of a sinusoidally varying phase shift, a phase shift varying as a sawtooth waveform, and a phase shift varying as a triangular wave.

* * * * *